(12) United States Patent
Apel

(10) Patent No.: US 8,093,959 B1
(45) Date of Patent: Jan. 10, 2012

(54) COMPACT, LOW LOSS, MULTILAYER BALUN

(75) Inventor: Thomas R. Apel, Portland, OR (US)

(73) Assignee: Triquint Semiconductor, Inc., Portland, OR (US)

( * ) Notice: Subject to any disclaimer, the term of this patent is extended or adjusted under 35 U.S.C. 154(b) by 144 days.

(21) Appl. No.: 12/405,158

(22) Filed: Mar. 16, 2009

(51) Int. Cl.
*H03H 7/42* (2006.01)
*H01P 3/08* (2006.01)

(52) U.S. Cl. .......................................... 333/26; 333/238

(58) Field of Classification Search ............ 333/25, 333/26, 238
See application file for complete search history.

(56) References Cited

U.S. PATENT DOCUMENTS

| 4,446,445 | A | | 5/1984 | Apel |
| 4,467,293 | A | | 8/1984 | Apel |
| 4,800,344 | A | * | 1/1989 | Graham ............................ 333/25 |
| 5,574,411 | A | | 11/1996 | Apel et al. |
| 5,781,071 | A | * | 7/1998 | Kusunoki ....................... 330/269 |
| 6,407,647 | B1 | | 6/2002 | Apel et al. |
| 6,437,658 | B1 | | 8/2002 | Apel et al. |
| 6,798,039 | B1 | | 9/2004 | Gillespie et al. |
| 6,806,558 | B2 | | 10/2004 | Apel et al. |
| 6,819,200 | B2 | * | 11/2004 | Zhao et al. ........................ 333/26 |
| 6,882,240 | B2 | | 4/2005 | Apel et al. |
| 7,274,268 | B2 | * | 9/2007 | Vice et al. ........................ 333/26 |
| 7,282,903 | B2 | * | 10/2007 | Schwarz et al. ............. 324/76.22 |
| 7,385,458 | B2 | * | 6/2008 | McKay et al. .................... 333/26 |
| 7,439,842 | B2 | * | 10/2008 | Fujiki et al. .................... 336/200 |
| 7,495,525 | B2 | * | 2/2009 | Ilkov et al. ....................... 333/26 |
| 7,626,472 | B2 | * | 12/2009 | Davies-Venn et al. .......... 333/26 |
| 7,656,262 | B2 | * | 2/2010 | Muto ............................ 336/200 |
| 2003/0193079 | A1 | | 10/2003 | Apel |
| 2004/0178861 | A1 | | 9/2004 | Apel |
| 2007/0120621 | A1 | | 5/2007 | Kirkeby |

FOREIGN PATENT DOCUMENTS

| EP | 1845581 A2 | 10/2007 |
| EP | 1758200 B1 | 4/2008 |
| WO | 02060002 A1 | 8/2002 |
| WO | 02095865 A1 | 11/2002 |
| WO | 03088409 A1 | 10/2003 |

OTHER PUBLICATIONS

Park, Jong C.; Park, Jae Y.; Lee, Han S.; Fully Embedded 2.4GHz LC-Balun into Organic Package Substrate with Series Resonant Tank Circuit; IEEE; 2007; pp. 1901-1904; 1-4244-0688-9/07.
Sevick, Jerry; Design and Realization of Broadband Transmission Line Matching Transformers; IEEE Standards Press, Emerging Practices in Technology Papers; 1993; ISBN 1-55937-382-2; Piscataway, New Jersey, USA.
Kirkeby, Niels; Multilayer Baluns Break Size Barrier; Penton Media, Inc.; 2007; New York, NY, USA.

* cited by examiner

Primary Examiner — Dean Takaoka
(74) Attorney, Agent, or Firm — Schwabe Williamson & Wyatt

(57) ABSTRACT

Embodiments of a microelectronic device including laminate baluns are generally described herein. A microelectronic device may include a laminate structure including a plurality of laminate layers, a first balun element disposed in the laminate structure, and a second balun element disposed in the laminate structure, wherein at least a portion of the first balun element is situated over the second balun element. Other embodiments may be described and claimed.

17 Claims, 5 Drawing Sheets

COMPACT, LOW LOSS, MULTILAYER BALUN

TECHNICAL FIELD

Embodiments of the present disclosure relate generally to microelectronic devices including laminate baluns, and more particularly, to devices including multi-layer baluns, wherein at least a portion of a second balun element is situated over a first balun element.

BACKGROUND

Transmission line elements are sometimes used to create balanced transformers, unbalanced transformers, and balanced-unbalanced transformers (also referred to as baluns). These transformers may be used in integrated circuits such as radio-frequency (RF) power amplifiers and low noise amplifiers that operate at high frequencies.

Several ongoing challenges that confront RF power amplifiers are finding ways to improve power efficiency and linearity. Push-pull power amplifiers may have up to four times higher load impedance for a given power level than do conventional single-ended power amplifiers. This may allow for much lower loss in frequency bands below 500 megahertz (MHz). For higher frequency applications (e.g., 800 MHz and beyond) for compact and portable devices, the baluns, particularly those baluns used for output matching, may be prohibitively large or inefficient.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments of the disclosure are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element. In addition, although embodiments of the present invention may be shown and described as including a particular number of components or elements, embodiments of the invention are not limited to any particular number of components or elements.

Figure 1:
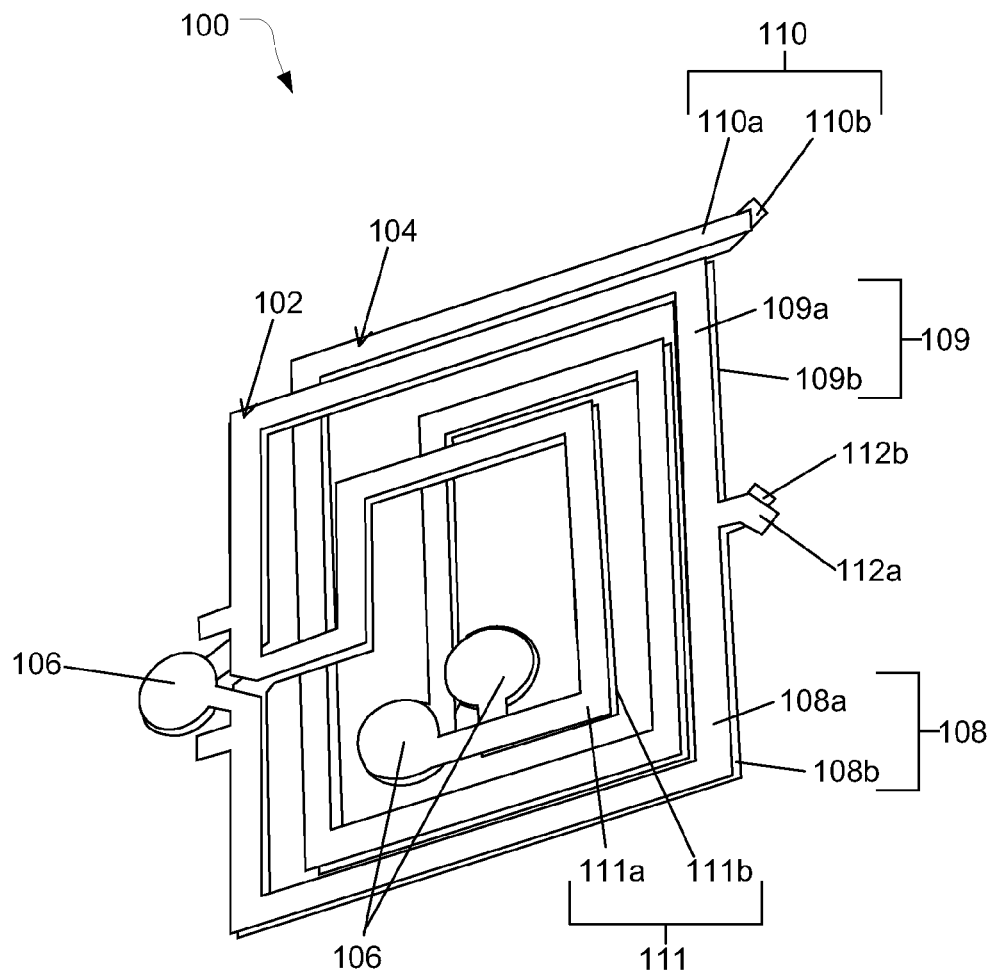
FIG. 1 is a perspective view of cascaded multi-layer balun elements in accordance with various embodiments.
Figure 2:
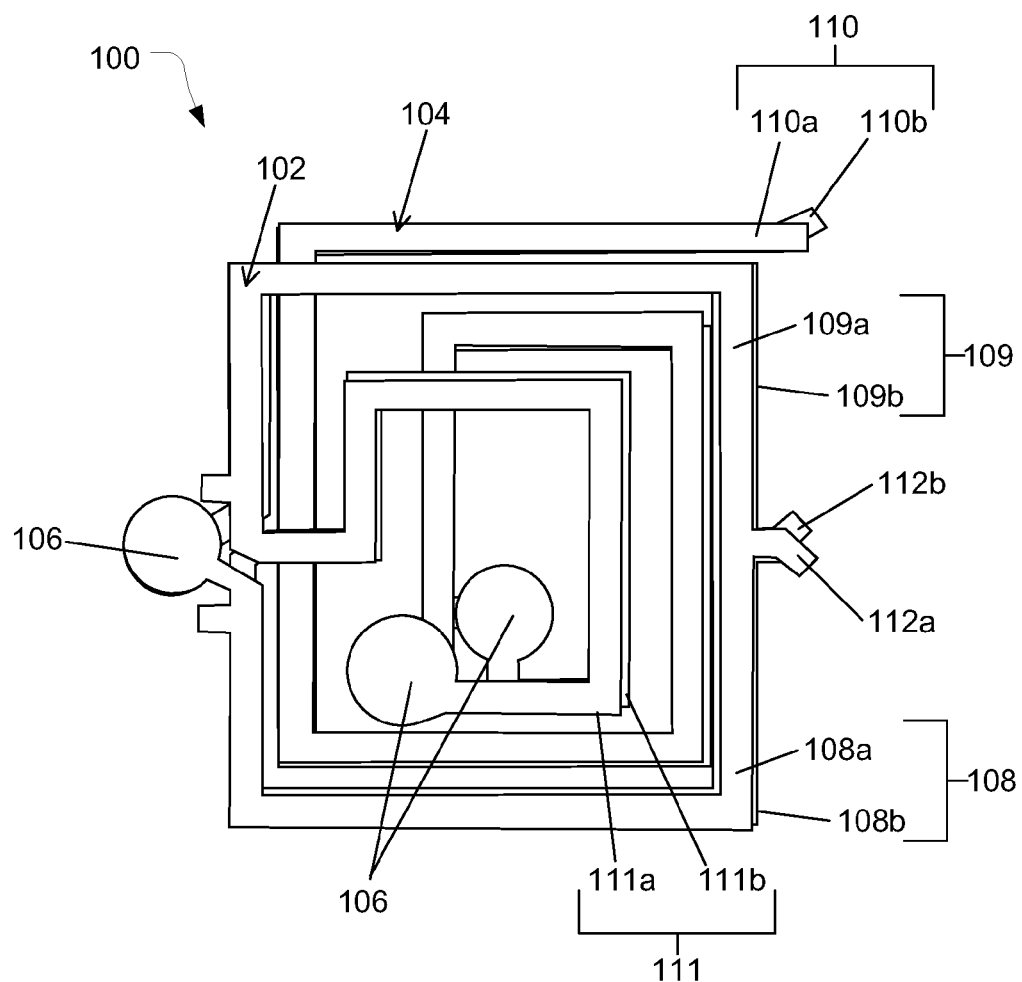
FIG. 2 is a top view of the device of FIG. 1.
Figure 3:
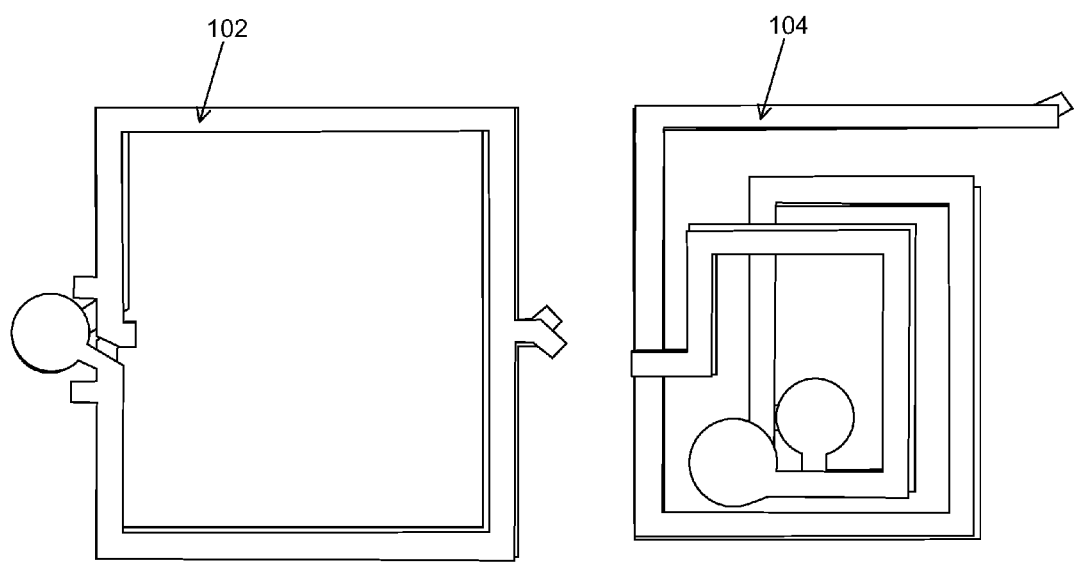
FIG. 3 is a top view of a device including balun elements in a horizontal arrangement.

Turning now to FIG. 1, illustrated is a perspective view of a device 100 including cascaded balun elements in accordance with various embodiments. A top view of the device 100 is illustrated in FIG. 2. The device 100 includes a first balun element 102 and a second balun element 104. At least a portion of the first balun element 102 may be situated over the second balun element 104 and coupled with the second balun element 104 and/or external components by way of through-holes (not illustrated) at various terminals 106. Cascading or stacking the balun elements 102, 104 vertically as illustrated such that the balun elements 102, 104 essentially share substantially the same footprint, may allow for the realization of a compact device 100 relative to one in which the balun elements 102, 104 are side-by-side horizontally (see, for example, the horizontal arrangement illustrated in FIG. 3).

In various embodiments, each of the balun elements 102, 104 may be realized in broadside coupled lines. In other words, transmission line elements 108a, 108b, 109a, 109b of the first balun element 102 may be oriented such that the transmission line elements 108a, 109a are situated substantially directly over the transmission line elements 108b, 109b, respectively. Similarly, the transmission line elements 110a, 110b, 111a, 111b of the second balun element 104 may be oriented such that the transmission line segments 110a, 111a are situated substantially directly over the transmission line elements 110b, 111b, respectively.

Transmission line segments 108, 109, 110, 111 may form balun elements 102, 104. To that end, transmission line elements of each transmission line segment 108, 109, 110, 111 may be parasitically coupled to define the balun elements 102, 104. More particularly, the transmission line element 108a may be parasitically coupled to the transmission line element 108b to define the transmission line segment 108. In a similar manner, the transmission line segment 109 may be formed from transmission line elements 109a, 109b. Together, transmission line segments 108, 109 form the first balun element 102. Similarly, the transmission line element 110a may be parasitically coupled to the transmission line element 110b to define the transmission line segment 110. Similarly, transmission line elements 111a, 111b together comprise the transmission line segment 111. Transmission lines 110, 111 in turn form the second balun element 104.

In various embodiments, the device 100 may be a laminate structure including a plurality of laminate layers. The multilayer baluns include transmission lines formed by transmission line elements 108a, 108b, 109a, 109b, 110a, 110b, 111a, 111b in separate layers (or sheets) of a laminate structure. The first balun element 102, for instance, may include transmission line elements 108a, 108b, 109a, 109b, with transmission line elements 108a, 109a being disposed in one layer, and 108b and 109b being disposed in a separate layer, the layers being separated by one or more dielectric layers.

Similarly, the second balun element 104 may include transmission line elements 110a, 110b, 111a, 111b, each transmission line element being disposed in a separate layer and separated by one or more dielectric layers.

The transmission line elements 108a, 108b, 109a, 109b, 110a, 110b, 111a, 111b may typically be formed of metal or other conductive material. In various embodiments, for example, the transmission line elements 108a, 108b, 109a, 109b, 110a, 110b, 111a, 111b may be formed of aluminum, gold, or another conductive material.

The dielectric layers 114 may be formed of any suitable insulating material. In various embodiments, for example, the dielectric layers 114 may be formed of bisbenzocyclobutene (BCB), a nitride, an oxide, or another insulating material.

Although the balun elements 102, 104 are depicted as having a generally square-like spiral shape, many other geometries may be possible. Circular, rectangular, etc., spiral or linear shapes may be used, for example.

It should also be noted that although the balun elements 102, 104 are depicted as having two transmission line segments each, other embodiments may be possible. A transmission line of a balun may include, for example, three or more transmission line segments formed in two, three, or more metal layers.

For the embodiment illustrated in FIG. 1 and FIG. 2, the first balun element 102 is a Guanella or auto-transformer balun, and the second balun element 104 is a current/choke balun. The first balun element 102 is a Guanella balun providing a transformation ratio of 4:1. Any N:1 transformation ratio, however, would be suitable and may depend on the particular application. Transformation ratios other than 4:1 are possible with first balun element 102 embodied more generally as an auto-transformer. Other balun types may be similarly suitable.

To that end, the transformation ratio may be modified by re-locating the low impedance ports 112a, 112b. As illustrated in FIG. 1 and FIG. 2, the low impedance ports 112a, 112b are substantially aligned with each other, forming a 4:1 Guanella transformer. Re-locating the low impedance ports 112a, 112b such that the low impedance ports 112a, 112b are no longer aligned may modify the transformation ratio in various embodiments.

Figure 4:
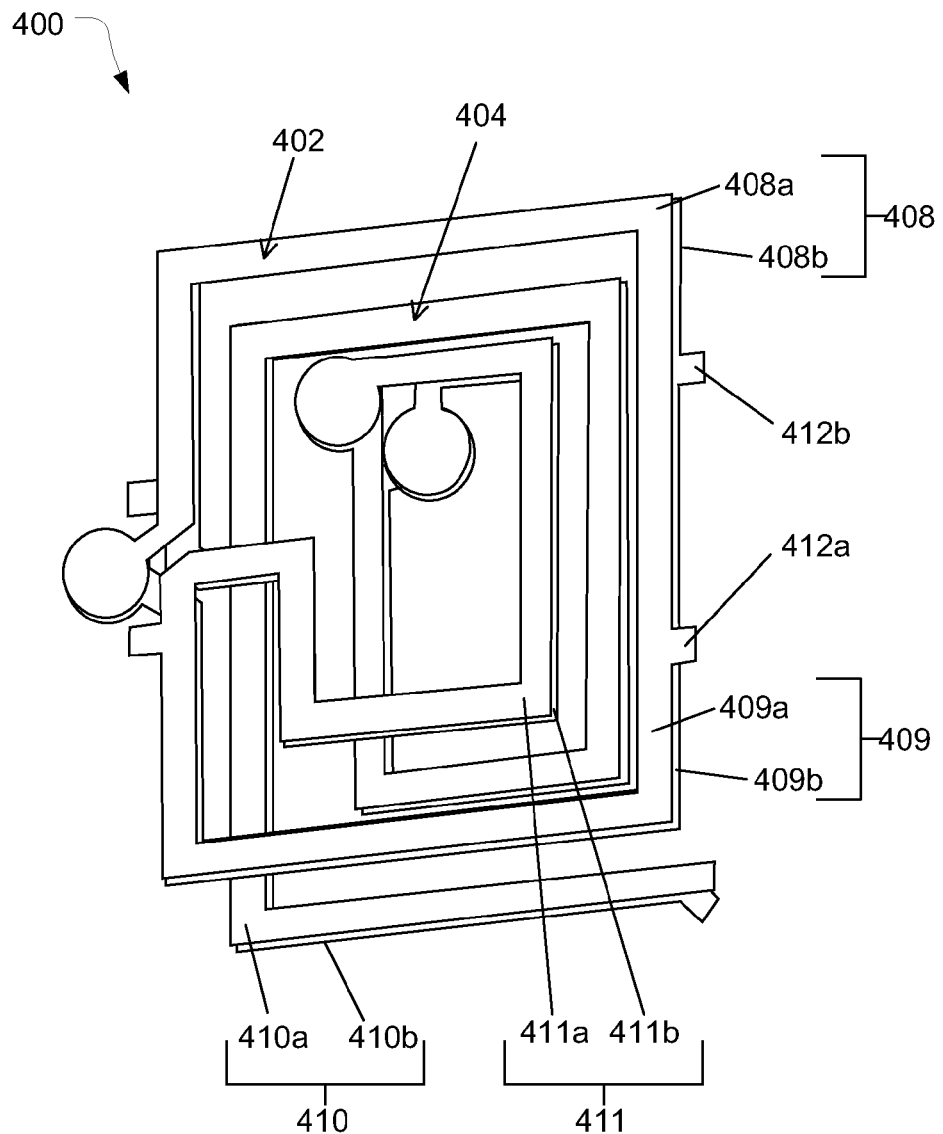
FIG. 4 is a perspective view of cascaded multi-layer balun elements including a multi-layer balun element having non-aligned low impedance ports in accordance with various embodiments.

As illustrated in FIG. 4, the device 400 includes a first balun element 402 and a second balun element 404, with each of the balun elements 402, 404 realized in broadside coupled lines, similar to the orientation of the device 100 illustrated in FIG. 1 and FIG. 2.

As illustrated, transmission line elements 408a, 408b, 409a, 409b of the first balun element 402 may be oriented such that the transmission line elements 408a, 409a are situated substantially directly over the transmission line elements 408b, 409b, respectively. Similarly, the transmission line elements 410a, 410b, 411a, 411b of the second balun element 404 may be oriented such that the transmission line segments 410a, 411a are situated substantially directly over the transmission line elements 410b, 411b, respectively.

Transmission line segments 408, 409, 410, 411 may form balun elements 402, 404. To that end, transmission line elements of each transmission line segment 408, 409, 410, 411 may be parasitically coupled to define the balun elements 402, 404. More particularly, the transmission line element 408a may be parasitically coupled to the transmission line element 408b to define the transmission line segment 408. In a similar manner, the transmission line segment 409 may be formed from transmission line elements 409a, 409b. Together, transmission line segments 408, 409 form the first balun element 402. Similarly, the transmission line element 410a may be parasitically coupled to the transmission line element 410b to define the transmission line segment 410. Similarly, transmission line elements 411a, 411b together comprise the transmission line segment 411. Transmission lines 410, 411 in turn form the second balun element 404.

Unlike the orientation of the device 100 illustrated in FIG. 1 and FIG. 2, the low impedance ports 412a, 412b of the first balun 402 are non-aligned. Rather than having a 4:1 transformation ratio, the first balun 402 has some other N:1 transformation ratio (e.g., the illustrated embodiment may have a transformation ratio somewhere around 3:1).

In various embodiments, the low impedance ports 412a, 412b may be oriented farther or closer to each other, depending on the desired transformation ratio.

Although the illustrated embodiment depicts the low impedance ports 412a, 412b being on the right-hand side of the first balun element 402, in various other embodiments the low impedance ports 412a, 412b may be disposed on any other side of the first balun element 402. For example, the low impedance ports 412a, 412b may be disposed on the top edge, bottom edge, or left-hand side of the first balun element 402.

Figure 5:
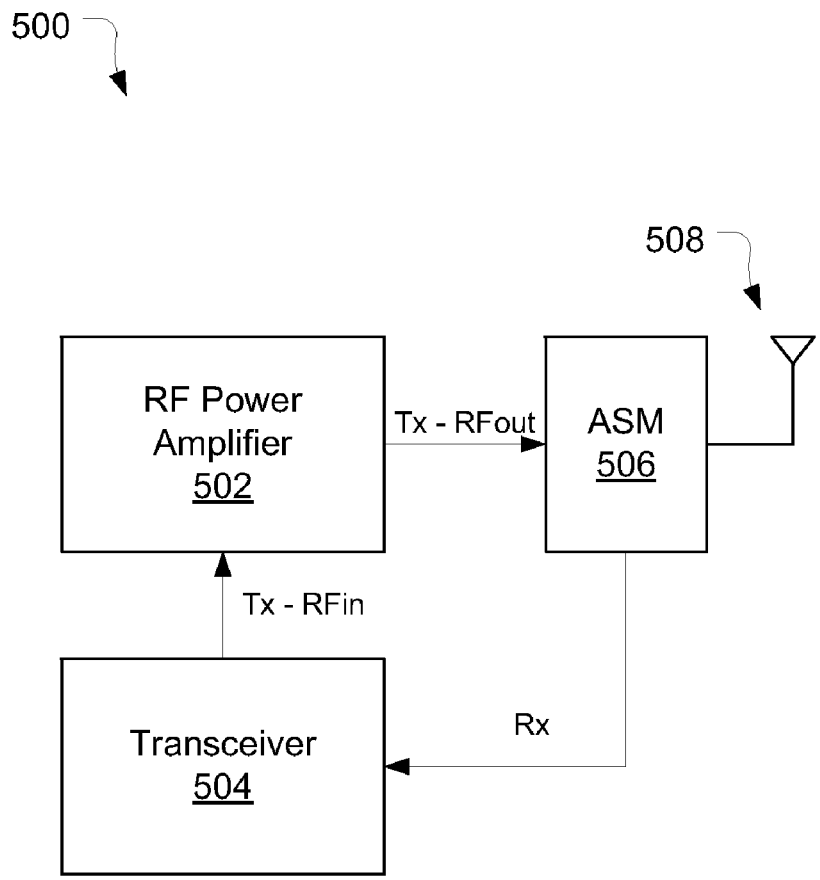
FIG. 5 is a block diagram of a system including a device having cascaded laminate balun elements in accordance with various embodiments.

Embodiments of devices described herein may be incorporated into various apparatuses and systems. A block diagram of an exemplary system 500 is illustrated in FIG. 5. As illustrated, the system 500 includes a radio frequency (RF) power amplifier 502 including a device in accordance with various embodiments of the present invention (e.g., device 100 or 400 of FIG. 1 or FIG. 4, respectively). The system 500 may include a transceiver 504 coupled with the RF power amplifier 502 as shown.

The RF power amplifier 502 may receive an RF input signal, RFin, from the transceiver 504. The RF power amplifier 502 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 5.

The amplified RF output signal, RFout, may be provided to an antenna switch module (ASM) 506, which effectuates an over the air (OTA) transmission of the RF output signal, RFout, via an antenna structure 508. The ASM 506 may also receive RF signals via the antenna structure 508 and couple the received RF signals, Rx, to the transceiver 504 along a receive chain.

In various embodiments, the antenna structure 508 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 500 may be any system including power amplification. In various embodiments, the system 500 may be particularly useful for power amplification at high radio frequency power and frequency. For example, the system 500 may be suitable for any one or more of terrestrial and satellite communications, radar systems, and possibly in various industrial and medical applications. Radar applications may include military-use radar, air traffic control, navigation, and the like.

Low loss impedance transforming baluns may be key to realizing practical push-pull power amplifiers. This type of balun performance may be enabled by broadside coupled lines in a cascaded orientation as described herein. As a result, push-pull power amplifiers may be realized in various applications (e.g., handset and networks applications) with superior performance. In embodiments, for example, GSM power amplifier efficiencies may be achieved in the 60% decade and beyond. Moreover, in addition to enhanced efficiency, applications including push-pull power amplifiers with baluns realized in broadside coupled lines in a cascaded orientation as disclosed may be operated with lower signal loss and increased linearity relative to various related art devices employing these techniques.

In various embodiments, the system 500 may be a selected one of a radar device, a satellite communication device, a mobile handset, a cellular telephone base station, a broadcast radio, or a television amplifier system. The system 500 may find applicability in other applications in which power amplification for high frequency transmission and/or reception is required.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
   a laminate structure including a plurality of laminate layers;
   a first balun disposed in the laminate structure; and
   a second balun disposed in the laminate structure, wherein at least a portion of the first balun is situated over the second balun;
   wherein the first balun is one of a Guanella balun or a current/choke balun, and wherein the second balun is the other one of the Guanella balun or the current/choke balun.

2. The apparatus of claim 1, wherein the first balun includes a first transmission line element disposed in a first laminate layer, and a second transmission line element disposed in a second laminate layer, wherein at least a portion of the first transmission line element is situated over the second transmission line element.

3. The apparatus of claim 2, wherein the first transmission line element and the second transmission line element are parasitically coupled.

4. The apparatus of claim 2, wherein the first transmission line element includes a first low impedance port, and the second transmission line element includes a second low impedance port.

5. The apparatus of claim 4, wherein the first low impedance port is non-aligned with the second low impedance port.

6. The apparatus of claim 2, wherein the second balun includes a third transmission line element disposed in a third laminate layer, and a fourth transmission line element disposed in a fourth laminate layer, wherein at least a portion of the third transmission line element is situated over the fourth transmission line element.

7. The apparatus of claim 5, wherein the third transmission line element and the fourth transmission line are parasitically coupled.

8. The apparatus of claim 1, wherein each of the first balun and the second balun includes at least one input to receive balanced signals and at least one output to output unbalanced signals.

9. The apparatus of claim 1, wherein the Guanella balun is a 4:1 Guanella balun.

10. A system comprising:
    a transceiver to provide a radio frequency (RF) input signal; and
    a radio frequency (RF) power amplifier coupled to the transceiver to receive the RF input signal from the transceiver and to transmit an RF output signal, the power amplifier including:
    a laminate structure including a plurality of laminate layers;
    a first balun disposed in the laminate structure; and
    a second balun disposed in the laminate structure, wherein at least a portion of the first balun is situated over the second balun;
    wherein the first balun is one of a Guanella balun or a current/choke balun, and wherein the second balun is the other one of the Guanella balun or the current/choke balun.

11. The system of claim 10, wherein the power amplifier is a push-pull power amplifier.

12. The system of claim 10, further comprising an antenna structure operatively coupled to the power amplifier and configured to facilitate transmission of the RF output signal.

13. The system of claim 10, wherein the system is a selected one of a radar device, a satellite communication device, a mobile handset, and a base station.

14. A method comprising:
    forming a first balun in a laminate structure; and
    forming a second balun in the laminate structure, wherein at least a portion of the first balun is situated over the second balun, wherein the first balun is one of a Guanella balun or a current/choke balun, and wherein the second balun is the other one of the Guanella balun or the current/choke balun.

15. The method of claim 14, wherein the forming the first balun comprises:
    forming a first transmission line element in a first laminate layer of the laminate structure; and
    forming a second transmission line element in a second laminate layer of the laminate structure, wherein at least a portion of the first transmission line element is situated over the second transmission line element and is configured to parasitically couple with the second transmission line element.

16. The method of claim 15, wherein the first transmission line element includes a first low impedance port, the second transmission line element includes a second low impedance port.

17. The method of claim 16, wherein the first low impedance port is non-aligned with the second low impedance port.

\* \* \* \* \*